United States Patent
Serizawa et al.

(10) Patent No.: US 6,528,900 B1
(45) Date of Patent: Mar. 4, 2003

(54) CIRCUIT CONNECTION ASSEMBLY FOR VEHICLE WIRE HARNESS

(75) Inventors: Yasuyoshi Serizawa, Shizuoka (JP); Kenji Iwasaki, Shizuoka (JP); Kentaro Shiraki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/545,835

(22) Filed: Apr. 10, 2000

(30) Foreign Application Priority Data

Apr. 30, 1999 (JP) .......................................... 11-124531

(51) Int. Cl.[7] .......................... H02G 3/00; H01R 33/00
(52) U.S. Cl. ......................................... 307/10.1; 439/34
(58) Field of Search ........................... 307/10.1; 439/34, 439/77

(56) References Cited

U.S. PATENT DOCUMENTS

| | | | | |
|---|---|---|---|---|
| 4,943,241 A | * | 7/1990 | Watanabe et al. | 439/34 |
| 5,993,247 A | * | 11/1999 | Kidd | 439/77 |
| 6,000,949 A | * | 12/1999 | Takiguchi et al. | 439/34 |
| 6,053,758 A | * | 4/2000 | Kato et al. | 439/364 |
| 6,217,358 B1 | * | 4/2001 | Norizuki et al. | 439/247 |

FOREIGN PATENT DOCUMENTS

DE 197 21 452 11/1997

* cited by examiner

*Primary Examiner*—Edward H. Tso
*Assistant Examiner*—Pia Tibbits
(74) *Attorney, Agent, or Firm*—Sughrue Mion, PLLC

(57) ABSTRACT

A flat circuit member 49 is connectable to a panel-side connector 58 on a flat circuit member 61 extending from auxiliary devices, mounted on a door panel, and is connected to a main switch unit 35 mounted on a door trim 37 covering a face of the door panel. The flat circuit member comprises a flexible wiring board having a control circuit section for controlling the auxiliary devices mounted on the door panel, and the flat circuit member is contiguously mounted on an outer peripheral face of a bracket 45, which supports the main switch unit 35. A connector fitting portion 69, which is connectable to the panel-side connector 58, is formed integrally with the bracket 45 fixed to the inner face of the door trim 37, and a terminal 59 on the flat circuit member 49 is arranged to coincide with a connector fitting hole 70 in the connector fitting portion 69.

12 Claims, 6 Drawing Sheets

CIRCUIT CONNECTION ASSEMBLY FOR VEHICLE WIRE HARNESS

BACKGROUND OF THE INVENTION

This invention relates to a circuit connection assembly for a wire harness in a vehicle, and more particularly to a circuit connection assembly for a vehicle wire harness in which auxiliary devices on a vehicle body panel can be easily and securely connected to auxiliary devices on an interior wall member.

Various vehicle body panel-side auxiliary devices, such for example as a power window opening-closing mechanism, a door mirror drive mechanism and a door lock mechanism, have heretofore been mounted on a door of an automobile. Wire harnesses, comprising many wires and connectors, are installed for electrically connecting these auxiliary devices. The wire harnesses are installed through an operation window mainly with a blind operation, and the mounting of the various auxiliary devices and the connection of the harnesses are very cumbersome. In addition, for electrical connection to the auxiliary devices, auxiliary devices, such as a switch unit, are mounted on an interior wall member such as a door trim, and it has been very cumbersome to connect the vehicle body panel-side auxiliary devices to the interior wall member-side auxiliary devices.

Therefore, there has been proposed a circuit connection assembly of an automobile door as shown in FIGS. 5 and 6.

The automobile door 1 comprises a door panel (vehicle body panel) 2 of metal, a panel unit 3 mounted on the door panel 2, and a door trim (interior wall member) 4 mounted on the door panel 2 to cover an interior-side face of the panel unit 3.

The panel unit 3 serves as a support structure which supports auxiliary devices on the door panel 2 such as a speaker 7, a door lock mechanism 9 and a power window opening-closing mechanism mounted within the door 1. In this illustrated example, a control circuit panel 8 for controlling the operations of the various auxiliary devices mounted on the panel unit 3 is also mounted on the panel unit 3.

This control circuit board 8 comprises a printed circuit board comprising a rigid insulating board on which necessary circuit patterns are printed, and various electronic and electrical parts, forming control circuit sections, are mounted on this printed circuit board. The control circuit board 8 is mounted on the panel unit 3, and is received in a protective casing except a connector portion 8a, connected to a switch unit (described later), so that the electronic and electrical parts, mounted on the printed circuit board, will not be damaged upon interference with neighboring objects.

The door trim 4 is the interior wall member forming the appearance of the interior of the car room. A switch-mounting opening 15 is formed in an upper face of a armrest 13 formed on the door trim 4 in a bulged manner, and the main switch unit 10 is mounted in the opening 15.

Various switches for operating the auxiliary devices mounted on the panel unit 3 are mounted on the main switch unit 10. As shown in FIG. 6, this main switch unit 10 comprises a switch casing 11 with an open bottom, and a switch board 12 through which key tops (operating keys) 12a are mounted on the switch casing 11 in such a manner that these key tops 12a are exposed to an upper face of the switch casing 11.

Elastic lock claws 11a, formed on an outer peripheral portion of the switch casing 11, are engaged with a peripheral edge 15a of the opening 15, thereby fixing the main switch unit 10 in position to the door trim 4.

The main switch unit 10, mounted in the opening 15 in the door trim 4, is electrically connected to the connector portion 8a of the control circuit board 8 on the panel unit 3 by a flat circuit member 17.

The flat circuit member 17 is a flexible wiring board comprising a flexible film on which contacts and circuit patterns are formed, and this flat circuit member 17 includes a contact section 17a on which a plurality of switch contacts are arranged, and a tongue-like connecting section 17b which is formed integrally with the contact section 17a and is connectable to the connector portion 8a of the control circuit board 8 on the panel unit 3. The connections of the respective switch contacts are switched by the switching operation of the switch board 12 effected in accordance with the operation of the key tops 12a.

As shown in FIG. 6, the contact section 17a is fitted into and fixed to an insertion guide 20, formed in the interior of the armrest 13 of the door trim 4, through a contact section holder 19.

The contact section holder 19 includes a base plate portion 19a and a lid portion 19b between which a peripheral edge portion of the contact section 17a is held. This contact section holder 19 has positioning projections 19c for locating the contacts on the flat circuit member 17 in predetermined positions, respectively. The contact section holder 19 is fixed in position in the insertion guide 20 by positioning member (not shown). The positioning projections 19 are engaged respectively in positioning holes 11c, formed respectively in distal ends of support posts 11b depending from the switch casing 11, thus serving also to position the main switch unit 10 in a horizontal direction.

On the other hand, the connecting section 17b is inserted into a recess in a housing (not shown) mounted on the inner face of the door trim 4, and cooperates with this housing to form a connector portion. Simultaneously when the door trim 4 is mounted on the door panel 2 on which the panel unit 3 is beforehand mounted, the connector portion 8a of the control circuit board 8 is connected to the connecting section 17b.

In the circuit connection assembly of the automobile door shown in FIGS. 5 and 6, the positioning of the switch board 12 is effected by the peripheral edge 15a of the opening 15 in the armrest 13 through the switch casing 11, whereas the positioning of the contact section 17a of the flat circuit member 17 to be electrically connected to the switch board 12 is effected by the insertion guide 20, formed in the interior of the door trim 4, through the contact section holder 19.

The switch board 12 and the contact section 17a, which are to be positioned in electrical contact with each other, are positioned on the basis of the different portions of the door trim 4, respectively. The door trim 4 is a molded product of a large size, and therefore its dimensional tolerance becomes large in some cases, and for this and other reasons, there is encountered a problem that it is difficult to properly position the switch contacts of the contact section 17a with respect to the switch board 12.

Since the door trim 4 is the large molded product, it is difficult to provide such dimensional precision as to secure the proper contact pressure of the connector terminals at the portion of electrical connection between the connector portion 8a of the control circuit board 8 and the connecting section 17b.

Therefore, the efficiency of the operation, in which the door trim 4 is mounted on the door panel 2 while securely connecting the main switch unit 10 on the door trim 4 to the auxiliary devices (including the speaker 7 and the door lock mechanism 9 mounted within the door 1) on the door panel 2, has not been high.

The control circuit board 8 for controlling the operations of the auxiliary devices is mounted on the panel unit 3 mounted on the door panel 2, and it is necessary to cover this control circuit board 8 with the protective casing except the connector portion 8a so that the electronic and electrical parts, mounted on the control circuit board 8, will not be damaged upon interference with neighboring objects. This has invited a problem that the production cost. increases.

SUMMARY OF THE INVENTION

It is therefore an object of this invention to provide a satisfactory circuit connection assembly for a vehicle wire harness, in which auxiliary devices on a vehicle body panel can be easily and securely connected to auxiliary devices on an interior wall member.

In order to achieve the above object, there is provided a circuit connection assembly for electrically connecting auxiliary devices mounted on a vehicle body panel and having a connector, and auxiliary devices mounted on an interior wall member attached to an inner face of the vehicle body panel, comprising:

a bracket body disposed between the vehicle body panel and the interior wall member, the bracket body integrally provided with a connector fitting portion to which the connector is to be fitted; and a flat circuit member provided as a flexible wiring board integrally including a control circuit section for controlling the auxiliary devices mounted on the vehicle body panel, and a connecting section having a terminal to be connected with the connector, the flat circuit member mounted on the bracket body so as to contiguously overlap an outer peripheral face of the bracket and such that the connecting section is positioned on the connector fitting section.

In the above construction, the flat circuit member, connected to the auxiliary devices on the interior wall member, comprises the flexible wiring board having the control circuit section for controlling the auxiliary devices on the vehicle body panel, and therefore this flat circuit member, while suitably bent, can be contiguously mounted on the outer peripheral face of the bracket attached to the interior wall.

Further, since the connector fitting portion is formed integrally with the bracket on which the flat circuit member is mounted, and the connecting section on the flat circuit member is mounted on the connector fitting portion, the dimensional tolerance of the connector fitting portion of the bracket can be made smaller as compared with the case where it is formed on the interior wall member which is a large molded product, and it is easy to provide such dimensional precision as to secure the proper contact pressure of the connector terminals at the portion of electrical connection to the auxiliary devices on the vehicle panel body.

Still further, since the control circuit for the auxiliary devices on the vehicle panel is previously incorporated into the bracket for the auxiliary devices on the interior wall member, the reliability of the electrical connecting portion is easily secured, and besides the auxiliary devices can be securely fixed to the inner face of the interior wall member through the bracket.

Preferably, the auxiliary devices mounted on the interior wall member includes a switch unit having a switch board on which a plurality of switches are arranged. The flat circuit member includes a switch contact section on which the switches of the switch board are to be contacted. The bracket body includes a horizontal portion on which the switch contact section of the flat circuit member is contiguously mounted.

In this case, the switch board for the auxiliary devices and the switch contact section of the flat circuit member, which must be positioned relative to each other in a good electrical-contact condition, are mounted on the switch contact holder of the single bracket in a superposed manner, and therefore the positioning references of the two coincide with each other, and the precision of positioning of the two relative to each other can be made high.

Preferably, the bracket body includes a vertical portion extended from one end of the horizontal portion, on which the control circuit section of the flat circuit member is contiguously mounted. The bracket body is attached to the interior wall member such that the control circuit is sandwiched between the vertical portion and the interior wall member. In this case, the control circuit section is covered and protected by the interior wall member and the bracket, and therefore requires no protective casing for exclusive use, and the number of the component parts, as well as the production cost, can be reduced.

Preferably, the connector fitting portion of the bracket includes a fixation member for fixing the connecting section of the flat circuit member thereon.

In this case, the connecting section is securely fixed on the bracket, and therefore before the auxiliary devices are mounted on the interior wall member, the connecting section will not hang down to hinder the assembling operation, and will not be damaged, and therefore the efficiency of the assembling operation at the time of fixing the auxiliary devices to the interior wall member is enhanced.

Preferably, the vehicle panel is a vehicle door panel, and the interior wall member is a vehicle door trim provided with an armrest portion on which the switch unit is mounted.

DETALED DESCRIPTION OF THE PREFERRED EMBODIMENTS

A circuit connection assembly for a vehicle wire harness, forming one preferred embodiment of the present invention, will now be described in detail with reference to the accompanying drawings.

Figure 1:
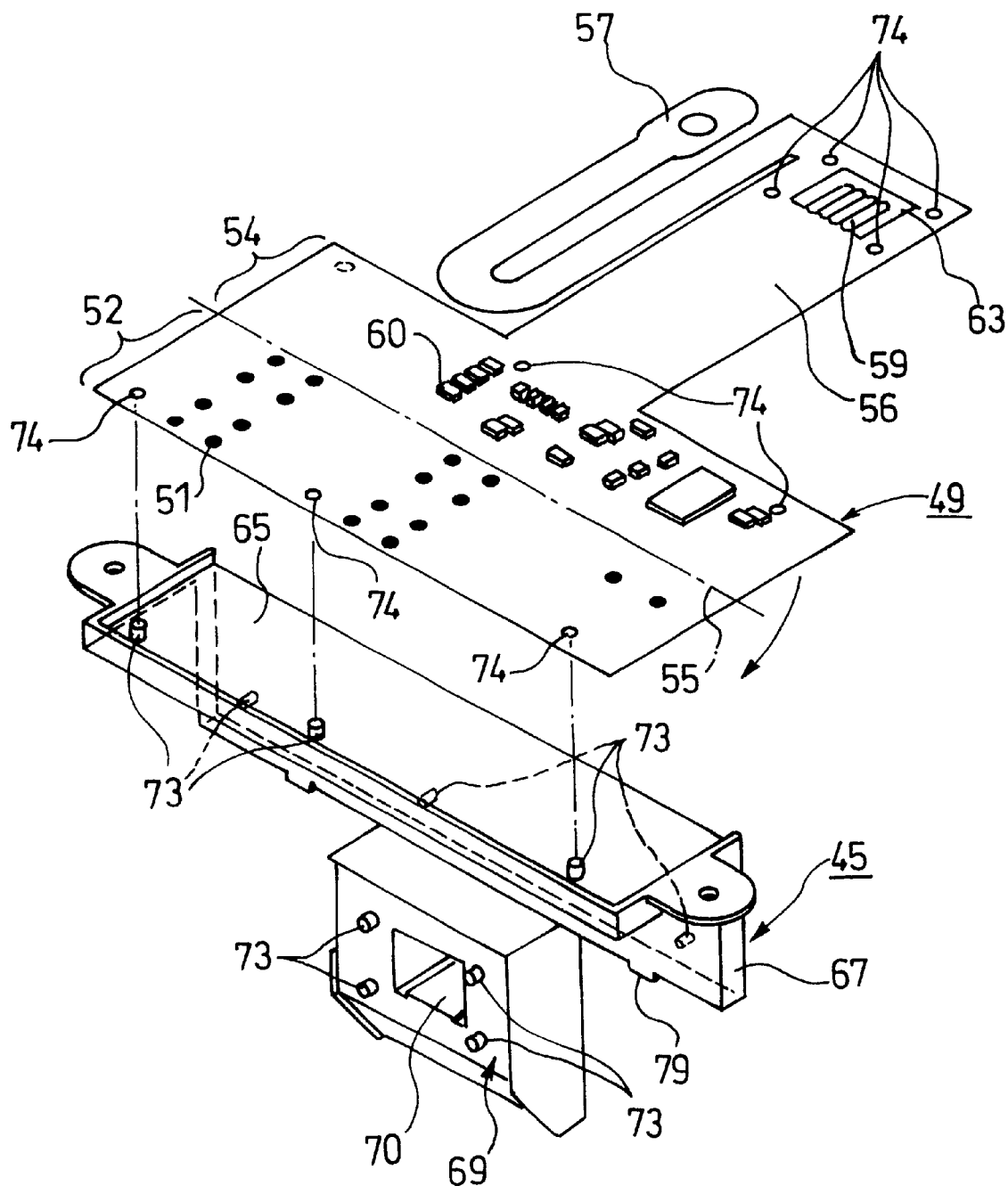
FIG. 1 is an exploded, perspective view of an essential portion an automobile door incorporating a circuit connection assembly for a vehicle wire harness according to the present invention.
Figure 2:
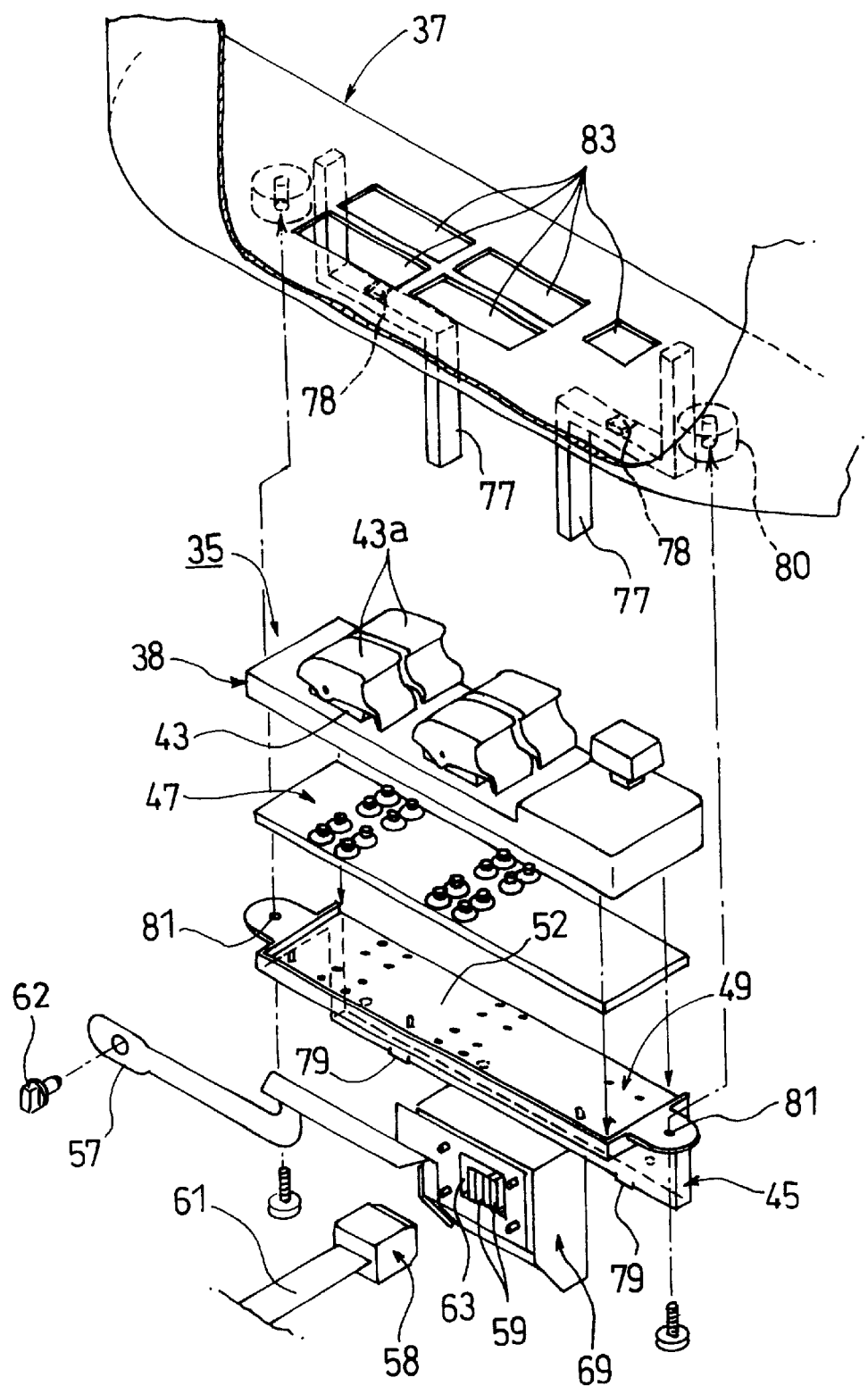
FIG. 2 is an exploded, perspective view showing the whole of the circuit connection assembly of the automobile door shown in FIG. 1.
Figure 3:
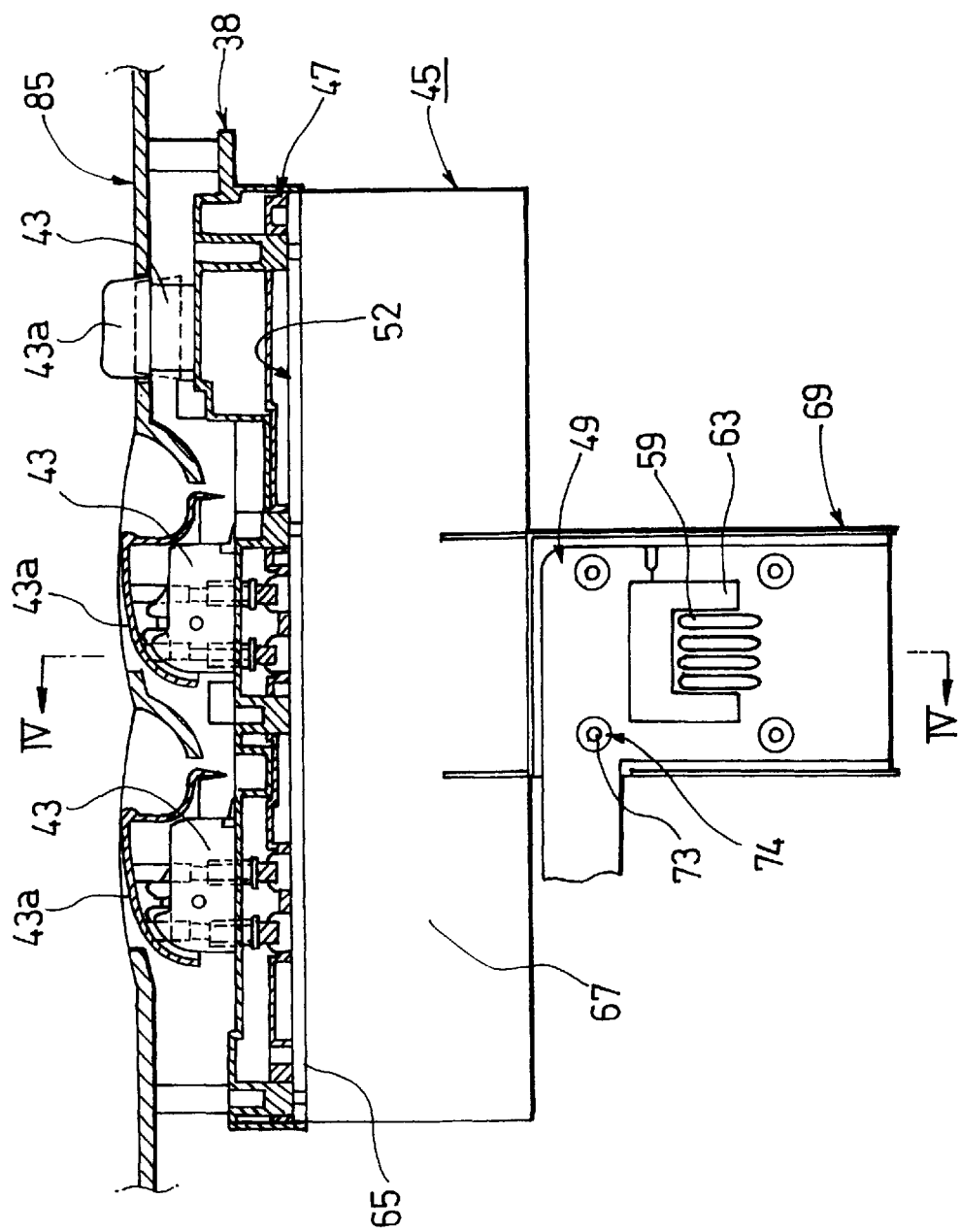
FIG. 3 is a longitudinal cross-sectional view of the circuit connection assembly of the automobile door of FIG. 2 in an assembled condition.
Figure 4:
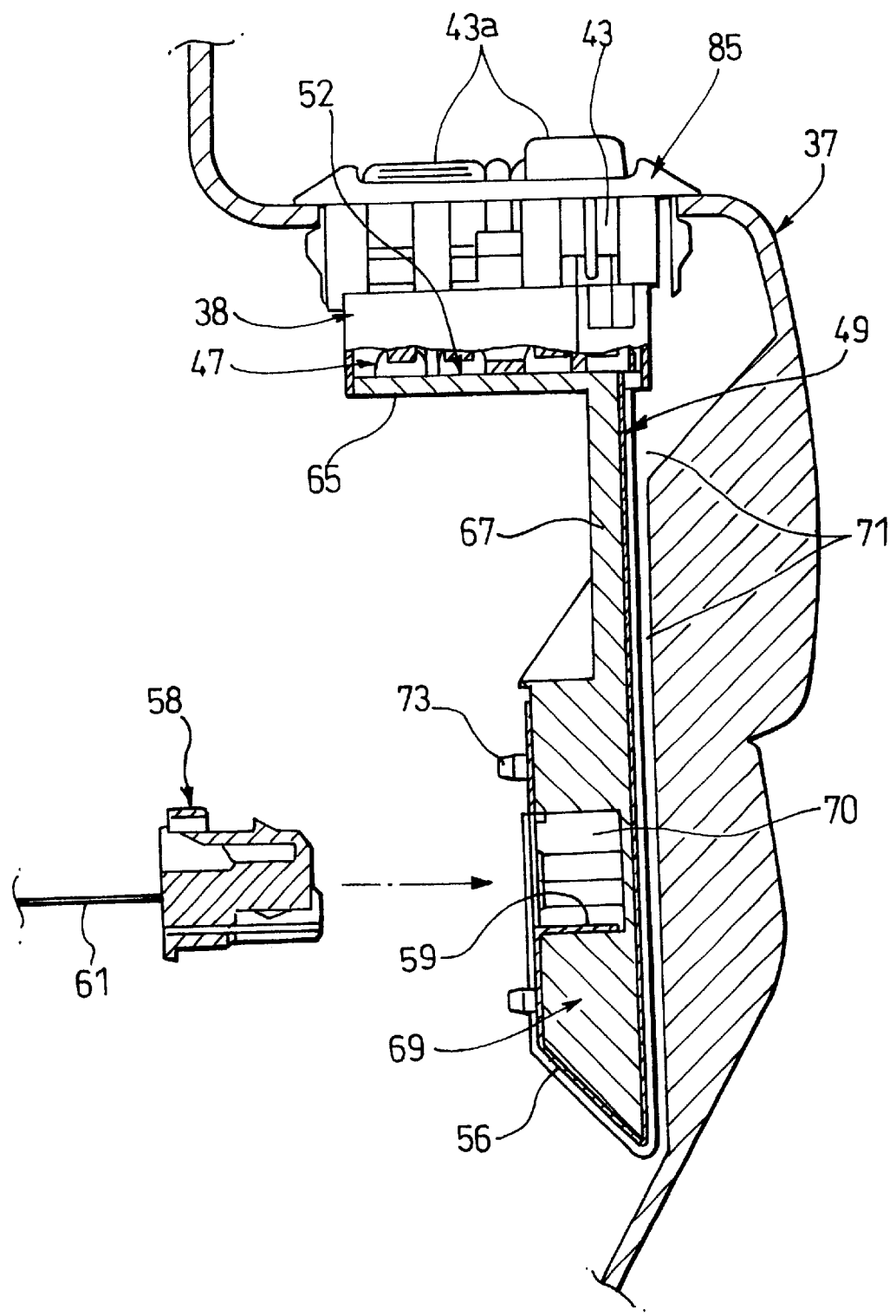
FIG. 4 is a transverse cross-sectional view of the circuit connection assembly of the automobile door of FIG. 2 in the assembled condition.

FIG. 1 is an exploded, perspective view of an essential portion an automobile door incorporating a circuit connection assembly for a vehicle wire harness according to the present invention. FIG. 2 is an exploded, perspective view showing the whole of the circuit connection assembly of the automobile door shown in FIG. 1. FIG. 3 is a longitudinal cross-sectional view of the circuit connection assembly of the automobile door of FIG. 2 in an assembled condition. FIG. 4 is a transverse cross-sectional view of the circuit connection assembly of the automobile door of FIG. 2 in the assembled condition.

Figure 5:
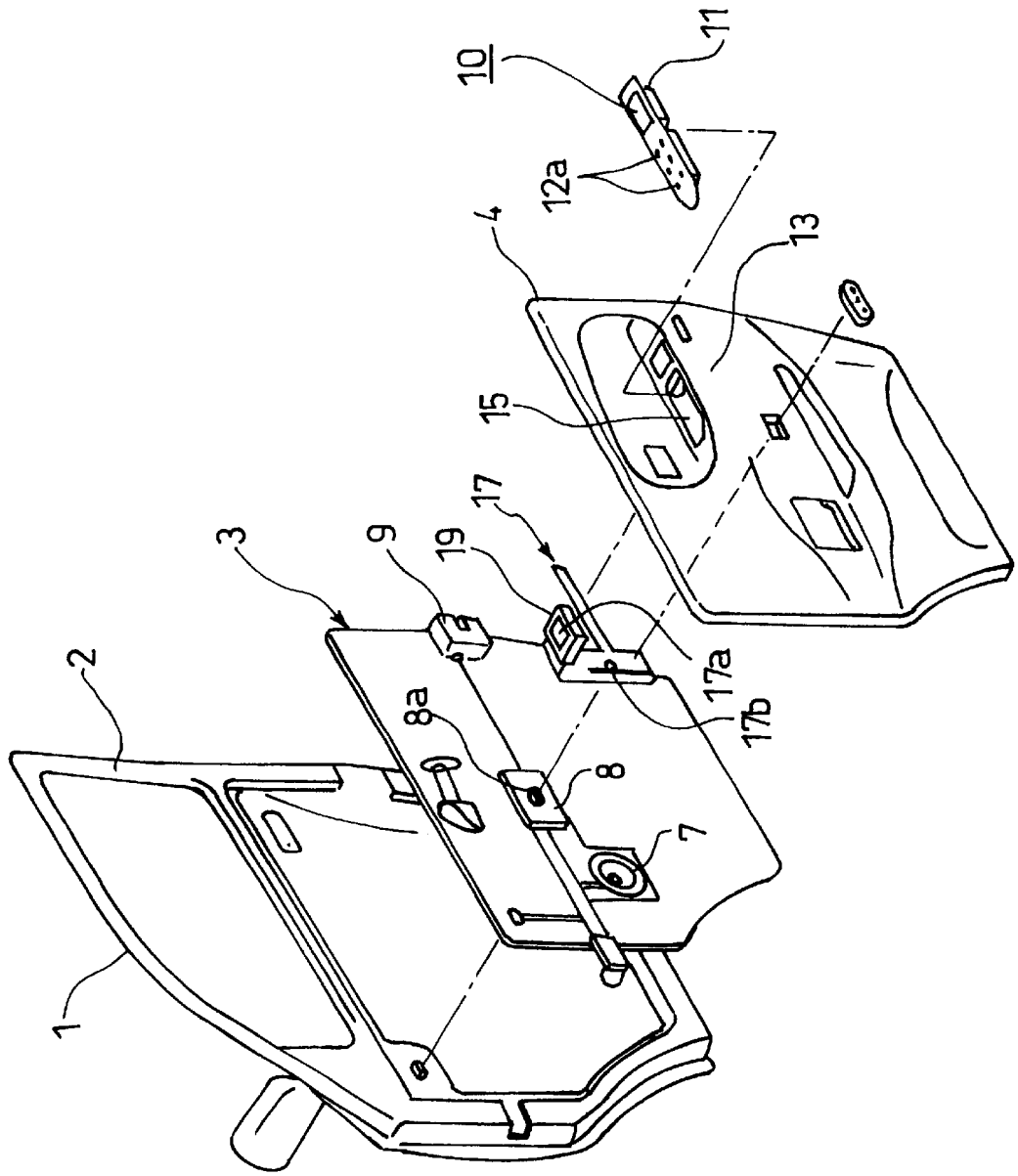
FIG. 5 is an exploded, perspective view showing the whole of a related circuit connection assembly of an automobile door.
Figure 6:
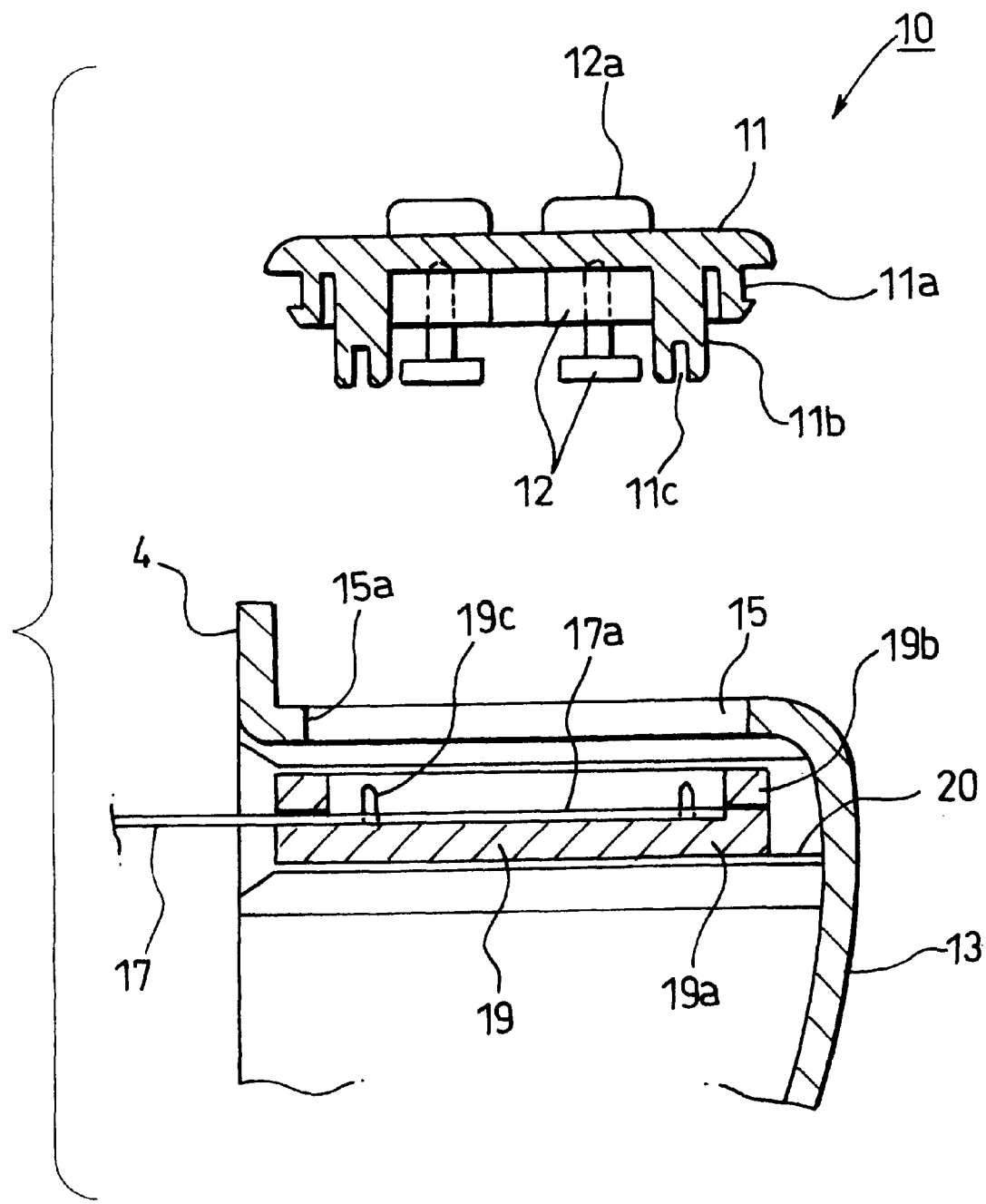
FIG. 6 is an exploded, cross-sectional view of a main switch unit in FIG. 5.

Like the door 1 shown in FIGS. 5 and 6, the automobile door of this embodiment comprises a door panel (vehicle body panel) made of metal (not shown), a panel unit (not shown), mounted on this door panel and serving as a support member which supports door panel-side auxiliary devices such as a speaker, a door lock mechanism and a power window opening-closing mechanism, and a door trim (interior wall member) 37 mounted on the door panel to cover an interior-side face of the panel unit. In this embodiment, however, a control circuit board, having a circuit for controlling the operations of the auxiliary devices mounted on the panel unit, is not mounted on the panel unit.

In this embodiment, a main switch unit (interior wall member-side auxiliary device) 35, mounted on the interior wall member, is fixedly secured to an inner face of the door trim 37 as shown in FIGS. 1 and 2, and can operate the auxiliary devices mounted on the panel unit.

As shown in FIG. 2, the main switch unit 35 comprises a switch casing 38 with an open bottom, a switch board 43 through which key tops (operating keys) 43a are mounted on the switch casing 38 in such a manner that these key tops 43a are exposed to an upper face of the switch casing 38, a bracket 45 mounted on the inner face (reverse face) of the door trim 37 to support the switch casing 38, a rubber contact 47 which is mounted on a lower face of the switch board 43, and supports conductors, which are to be contacted with switch contacts (described later), in a floating manner through rubber members, and a flat circuit member 49 which is contiguously mounted on the outer peripheral face of the bracket 45 in such a manner that at least part of this flat circuit member 49 underlaps the rubber contact 47.

As shown in FIG. 1, the flat circuit member 49 is a flexible wiring board comprising a flexible support member (e.g. a resin film) having contacts and circuit patterns formed on one side thereof. The flat circuit member 49 integrally includes: a switch contact section 52, having the plurality of switch contacts 51 which can be selectively contacted respectively with the conductors of the rubber contact 47 in accordance with the operation of the key tops 43a; a control circuit section 54 for controlling the operations of the vehicle body panel-side auxiliary devices; a strip-like extended section 56 which has a terminal (connecting section) 59 formed at a distal end portion thereof, and can be contiguously extended vertically to the inner face of the door trim 37; and a lamp circuit section 57 for feeding power to a courtesy lamp (auxiliary device) 62 mounted on the door trim 37.

In this embodiment, the flat circuit member 49 can be connected to the door panel-side auxiliary devices, mounted on the panel unit, via the terminal 59, and also is connected to the auxiliary devices (including the main switch unit 35 and the courtesy lamp) mounted on the door trim 37.

Electrical and electronic parts 60, required for controlling the door panel-side auxiliary devices, are mounted on the control circuit section 54.

The terminal (connecting section) 59, which can be connected to a panel-side connector 58 of a flat circuit member 61 extending from the door panel-side auxiliary devices, is formed at the distal end portion of the strip-like extended section 56 extending from the control circuit section 54. In this embodiment, a U-shaped notch or opening 63 is formed so as to surround the terminal 59, and the panel-side connector 58 can be inserted into this opening 63.

As shown in FIG. 1, the bracket 45 includes: a switch contact holder 65 on which the switch contact section 52 of the flat circuit member 49 is positioned and fixed in accordance with the array of key tops 43a on the switch board 43; a control circuit protector 67 on which the control circuit section 54 is positioned and fixed in a protective manner; and a connector fitting portion 69 with which for the panel-side connector 58 is fitted. This bracket 45 is integrally molded of an insulating resin material, and has a generally L-shaped cross-section, and the control circuit protector 67 depends from one edge of the switch contact holder 65.

A connector fitting hole 70, into which the panel-side connector 58 can be fitted, is formed in the connector fitting portion 69, and the opening 63 in the terminal 59 is arranged to coincide with the connector fitting hole 70.

As shown in FIG. 4, the control circuit protector 67 cooperates with the inner face of the door trim 37 to form a space 71 therebetween for receiving the control circuit section 54 in a protective manner.

The flat circuit member 49 is bent at a boundary line 55 (FIG. 1) between the switch contact section 52 and the control circuit section 54 into an L-shape, and is mounted on the outer peripheral face of the bracket 45 in such a manner that the switch contact section 52 contiguous lies on the switch contact holder 65 while the control circuit section 54 contiguous lies on the control circuit protector 67.

Fixing pins 73 are formed on the switch contact holder 65, the control circuit protector 67 and the connector fitting portion 69 of the bracket 45, and positioning holes 74 for fitting on the respective fixing pins 73 are formed through the flat circuit member 49. Therefore, the flat circuit member 49, mounted on the bracket 45, is properly positioned by the fixing pins 73 fitted in the respective positioning holes 74.

In the main switch unit 35 of this embodiment, the flat circuit member 49, the rubber contact 47 and the switch casing 38 are sequentially mounted on the bracket 45 to provide an assembly, and thereafter this assembly is mounted on the inner face of the door trim 37.

As shown in FIG. 2, protective ribs 77 are formed on that portion of the inner face of the door trim 37 on which the bracket 45 is to be mounted, and these protective ribs 77 can position the bracket 45 in surrounding relation to the peripheries of the control circuit section 54 and the extended section 56 (which pass through the space between the bracket 45 and the door trim 37) while protecting the electrical and electronic parts 60 mounted on the control circuit section 54.

Retaining projections 79 are formed on the lower edge of the control circuit protector 67 of the bracket 45, and are fitted respectively in engagement recesses 78, formed respectively in the protective ribs 77, thereby fixing the bracket 45 to the door trim 37. Screw holes 81 are formed respectively in opposite ends of the switch contact holder 65 of the bracket 45, and these opposite ends are fixedly secured by screws respectively to mounting bosses 80 on the door trim 37 through these screw holes 81.

The key tops 43a of the switch board 43, mounted on the inner side of the door trim 37 through the bracket 45, pass respectively through key through holes 83, formed in an armrest formed on the door trim 37 in a bulged manner, and project toward the upper side of the door trim 37. A gap around each key top 43a, passing through the key through hole 83, is covered and concealed by a bezel 85 mounted on the door trim 37, as shown in FIGS. 3 and 4.

In the circuit connection assembly of this embodiment for the automobile door, the flat circuit member 49, connected to the auxiliary devices (the main switch unit 35 and the courtesy lamp 62) mounted on the door trim 37, comprises the flexible wiring board having the control circuit section 54 for controlling the door panel-side auxiliary devices, and therefore this flat circuit member 49, while suitably bent into an L-shape, can be contiguously mounted on the outer peripheral face of the bracket 45.

The control circuit section 54 is covered and protected by the door trim 37 and the bracket 45, and therefore requires no protective casing for exclusive use, and therefore the number of the component parts, as well as the production cost, can be reduced.

The connector fitting portion 69, connectable to the door panel-side auxiliary devices, is formed integrally with the bracket 45 of the main switch unit 35 on which the flat circuit member 49 is to be mounted, and the opening 63 of the terminal 59 on the flat circuit member 49 is arranged to coincide with the connector fitting hole 70 in the connector fitting portion 69, thus forming an electrical connecting portion.

Therefore, the dimensional tolerance of the connector fitting portion 69 of the bracket 45 can be made smaller as compared with the case where it is formed on the door trim 37 which is the large molded product, and it is easy to provide such dimensional precision as to secure the proper contact pressure of the connector terminals when the panel-side connector 58 of the flat circuit member 61, extending from the door panel-side auxiliary devices, is connected to the terminal 59, and the reliability of the portion of electrical connection between the panel-side connector 58 and the terminal 59 can be secured easily and securely.

The terminal 59 on the flat circuit member 49 is formed at the distal end portion of the extended section 56 which is part of the flexible wiring board having excellent flexibility, and therefore the extended section 56 can be suitably arranged and fixedly mounted relative to the connector fitting hole 70 of the connector fitting portion 69, and the direction of fitting of the connector fitting hole 70 on the panel-side connector 58 is the direction of the thickness of the door trim 37 so that a large force can be applied during the connector fitting operation.

The terminal 59, formed at the distal end portion of the extended section 56, is positioned and fixed by the fixing pins (fixing means) 73 formed on the connector fitting portion 69, and therefore the extended section 56 can be contiguously mounted on the bracket 45. Therefore, before the main switch unit 35 is mounted on the door trim 37, the extended section 56 will not hang down to hinder the assembling operation, and will not be damaged, and therefore the efficiency of the assembling operation at the time of fixing the main switch unit to the door trim 37 is enhanced.

In the main switch unit 35, the flat circuit member 49, having the control circuit section 54, is beforehand incorporated in the main switch unit 35 to form an assembly of the main switch unit 35, and therefore the reliability of the electrical connecting portion is easily secured.

In this embodiment, the flat circuit member 49 has the switch contact section 52 of the main switch unit 35, and the switch contact section 52 is mounted on the switch contact holder 65 of the bracket 45, and the switch board 43 is provided above the switch contact section 52 of the flat circuit member 49 mounted on the bracket 45.

The switch board 43 and the switch contact section 52 of the flat circuit member 49, which must be positioned relative to each other in a good electrical-contact condition, are mounted on the switch contact holder 65 of the single bracket 45 in a superposed manner, and therefore the positioning references of the two coincide with each other, and the precision of positioning of the two relative to each other can be made high.

Therefore, a dimensional error between the switch board 43, mounted on the switch casing 38, and the switch contact section 52 of the flat circuit member 49 can be easily kept within an allowable range, and the reliability of the electrical contact portion can be secured easily and securely.

In the circuit connection assembly of this embodiment for the automobile door, the efficiency of the assembling operation at the time of connecting the terminal 59 to the panel-side connector 58 of the flat circuit member 61, extending from the door panel-side auxiliary devices, as well as the efficiency of the assembling operation at the time of fixing the assembled main switch unit 35 to the door trim 37, can be enhanced.

The main switch unit 35 can be securely fixed to the inner face of the door trim 37 through the bracket 45, and therefore the harness will not be disengaged and moved out of the door trim 37, for example, by an impact produced at the time of collision of the vehicle, and the improper operation of the switches is prevented.

The circuit connection assembly of the invention for the vehicle wire harness is not limited to the circuit connection assembly of the above embodiment for the automobile door.

For example, the invention can be applied to a structure in which auxiliary devices (such as a room lamp and a sun roof opening-closing mechanism), mounted on a ceiling panel (vehicle body panel) are connected by circuits to an auxiliary device (such as a switch unit for controlling the auxiliary devices on the ceiling panel) mounted on a ceiling wall member (interior wall member).

The bracket 45, fixed to the inner face of the interior wall member, is not limited to an L-shaped cross-section, but can be suitably changed in shape in accordance with the shape of a portion on which the bracket is to be mounted, and the flat circuit member, comprising the flexible wiring board, can be contiguously mounted on the outer peripheral face of the bracket.

In the circuit connection assembly of the invention for the vehicle wire harness, the flat circuit member, connected to the auxiliary devices on the interior wall member, comprises the flexible wiring board having the control circuit section for controlling the auxiliary devices on the vehicle body panel, and therefore this flat circuit member, while suitably bent, can be contiguously mounted on the outer peripheral face of the bracket for the interior wall member-side auxiliary devices.

The control circuit section is covered with the interior wall member and the bracket, and therefore requires no protective casing for exclusive use.

The connector fitting portion, which is connectable to the auxiliary devices on the vehicle body panel, is formed integrally with the bracket (for the auxiliary devices on the interior wall member) on which the flat circuit member is mounted, and the connecting section on the flat circuit member is mounted on the connector fitting portion.

Therefore, the dimensional tolerance of the connector fitting portion of the bracket can be made smaller as compared with the case where it is formed on the interior wall member which is a large molded product, and it is easy to provide such dimensional precision as to secure the proper contact pressure of the connector terminals at the portion of electrical connection to the auxiliary devices on the vehicle panel body.

In the auxiliary devices on the interior wall member, the flat circuit member, having the control circuit section, is beforehand incorporated in the auxiliary devices to form an assembly of the auxiliary devices, and therefore the reliability of the electrical connecting portion is easily secured, and besides the auxiliary devices can be securely fixed to the inner face of the interior wall member through the bracket.

Therefore, there can be provided the satisfactory circuit connection assembly for the vehicle wire harness, in which the auxiliary devices on the vehicle body panel can be easily and securely connected to the auxiliary devices on the interior wall member.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A circuit connection assembly for electrically connecting auxiliary devices mounted on a vehicle body panel and having a connector, and auxiliary devices mounted on an interior wall member attached to an inner face of the vehicle body panel, comprising:

a bracket body disposed between the vehicle body panel and the interior wall member, the bracket body integrally provided with a connector fitting portion to which the connector is to be fitted; and a flat circuit member provided as a flexible wiring board integrally including a control circuit section for controlling the auxiliary devices mounted on the vehicle body panel, and a connecting section having a terminal to be connected with the connector, the flat circuit member mounted on the bracket body so as to contiguously overlap an outer peripheral face of the bracket and such that the connecting section is positioned on the connector fitting portion.

2. The circuit connection assembly as set forth in claim 1, wherein the auxiliary devices mounted on the interior wall member includes a switch unit having a switch board on which a plurality of switches are arranged;

wherein the flat circuit member includes a switch contact section on which the switches of the switch board are to be contacted; and wherein the bracket body includes a horizontal portion on which the switch contact section of the flat circuit member is contiguously mounted.

3. The circuit connection assembly as set forth in claim 2, wherein the bracket body includes a vertical portion extended from one end of the horizontal portion, on which the control circuit section of the flat circuit member is contiguously mounted; and wherein the bracket body is attached to the interior wall member such that the control circuit is sandwiched between the vertical portion and the interior wall member.

4. The circuit connection assembly as set forth in claim 1, wherein the connector fitting portion of the bracket includes a fixation member for fixing the connecting section of the flat circuit member thereon.

5. The circuit connection assembly as set forth in claim 1, wherein the bracket body is attached to the interior wall member such that the control circuit is sandwiched between the interior wall member and the outer peripheral face thereof on which the control circuit is contiguously mounted.

6. The circuit connection assembly as set forth in claim 1, wherein the vehicle panel is a vehicle door panel, and the interior wall member is a vehicle door trim provided with an armrest portion on which the switch unit is mounted.

7. The circuit connection assembly as set forth in claim 1, wherein said outer peripheral face that is contiguously overlapped by said flat circuit member comprises two at least partially planar sections formed at an angle from each other.

8. The circuit connection assembly as set forth in claim 1, wherein said flat circuit member further comprises a switch contact section bendably connected to said control circuit section.

9. The circuit connection assembly as set forth in claim 8, wherein said flat circuit member further comprises a strip like extended section connected to said control circuit section.

10. The circuit connection assembly as set forth in claim 8, wherein said bracket body has a first surface and a second surface, wherein said first surface is covered by said switch contact section, and said second surface is covered by said control circuit section.

11. The circuit connection assembly as set forth in claim 8, wherein said bracket body has a first surface and a second surface, and a connector fitting portion, wherein said first surface is covered by said switch contact section, said second surface is covered by said control circuit section, and said connector fitting portion is covered by said strip like extended section.

12. The circuit connection assembly as set forth in claim 9, wherein said flat circuit member further comprises a lamp circuit section connected to said strip like extended section.

* * * * *